United States Patent
Lee et al.

(10) Patent No.: US 8,530,294 B2
(45) Date of Patent: Sep. 10, 2013

(54) STRESS MODULATION FOR METAL GATE SEMICONDUCTOR DEVICE

(75) Inventors: Wei-Yang Lee, Taipei (TW);
Meng-Hsuan Chan, Taipei (TW);
Huang Ching Yu, Baoshan Township, Hsinchu County (TW); Da-Yuan Lee, Jhubei (TW); Kuang-Yuan Hsu, Fongyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 13/278,725

(22) Filed: Oct. 21, 2011

(65) Prior Publication Data
US 2013/0102142 A1  Apr. 25, 2013

(51) Int. Cl.
*H01L 21/8238* (2006.01)

(52) U.S. Cl.
USPC .................. 438/199; 438/303; 257/E21.632

(58) Field of Classification Search
USPC .. 438/197, 199, 230, 231, 303; 257/E21.632
See application file for complete search history.

(56) References Cited

U.S. PATENT DOCUMENTS

| 7,994,051 B2 | 8/2011 | Hung et al. |
| 2009/0194816 A1* | 8/2009 | Onoda ........................ 257/369 |

OTHER PUBLICATIONS

Da-Yuan Lee and Kuang-Yuan Hsu; "Replacement Gate Semiconductor Device;" U.S. Appl. No. 13/245,581, filed Sep. 26, 2011; 25 Pages.

* cited by examiner

*Primary Examiner* — Hoai V Pham
(74) *Attorney, Agent, or Firm* — Hayes and Boone, LLP

(57) ABSTRACT

The present disclosure provides a method of semiconductor device fabrication including removing a sacrificial gate structure formed on a substrate to provide an opening. A metal gate structure is then formed in the opening. The forming of the metal gate structure includes forming a first layer (including metal) on a gate dielectric layer, wherein the first layer includes a metal and performing a stress modulation process on the first layer. The stress modulation process may include ion implantation of a neutral species such as silicon, argon, germanium, and xenon.

20 Claims, 11 Drawing Sheets

US 8,530,294 B2

STRESS MODULATION FOR METAL GATE SEMICONDUCTOR DEVICE

BACKGROUND

The present disclosure relates generally to forming an integrated circuit device on a substrate and, more particularly, to forming a gate structure of a semiconductor device.

Semiconductor device geometries continue to dramatically decrease in size. Today's fabrication processes are routinely producing devices having feature dimensions less than 65 nm. However, solving the problems associated with implementing new process and equipment technology while continuing to satisfy device requirements has become more challenging. For example, metal-oxide-semiconductor (MOS) transistors have typically been formed with polysilicon gate electrodes. Polysilicon has advantageous thermal resistive properties and can allow for formation of self aligned source/drain structures.

However, in order to continually meet performance requirements, there has been a desire to replace the polysilicon gate electrode with a metal gate electrode. One process of implementing metal gates is termed a "gate last" or "replacement gate" methodology. In such a process, a dummy (e.g., sacrificial) polysilicon gate is initially formed, various processes associated with the semiconductor device are performed, and the dummy gate is subsequently removed and replaced with a metal gate. Challenges also arise in the formation of the metal gate structure and providing adequate performance for the associated transistor. For example, to boost NMOS transistor performance it is helpful to generate a tensile force in the channel. Thus, though current methods and devices are in many ways sufficient and effective for their purposes, it is desired to simplify and/or improve the processes and resultant devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
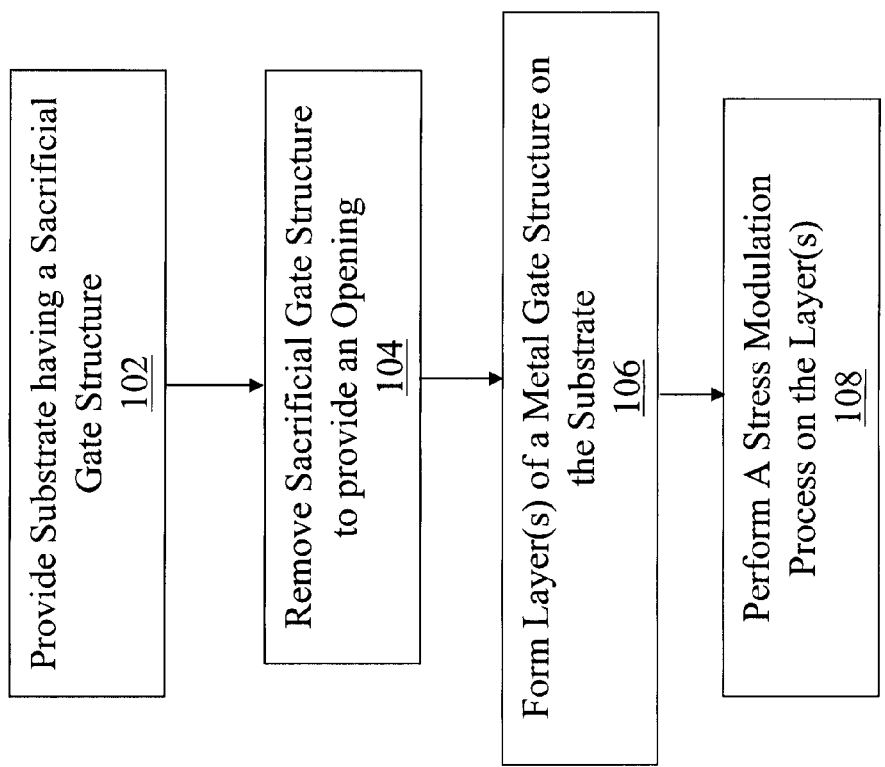
FIG. 1 is flow chart of an embodiment of a method of forming a metal gate structure according to one or more aspects of the present disclosure.
Figure 8:
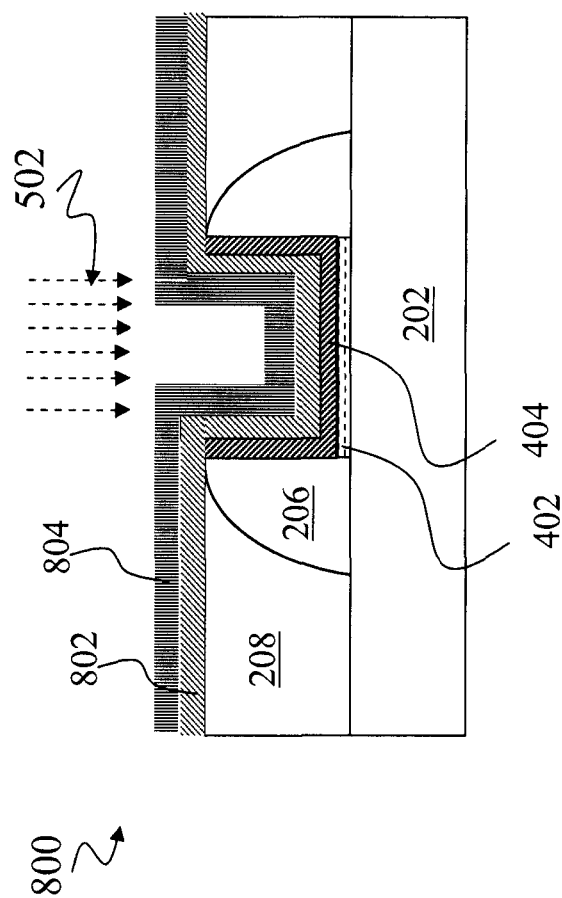
Figure 9:
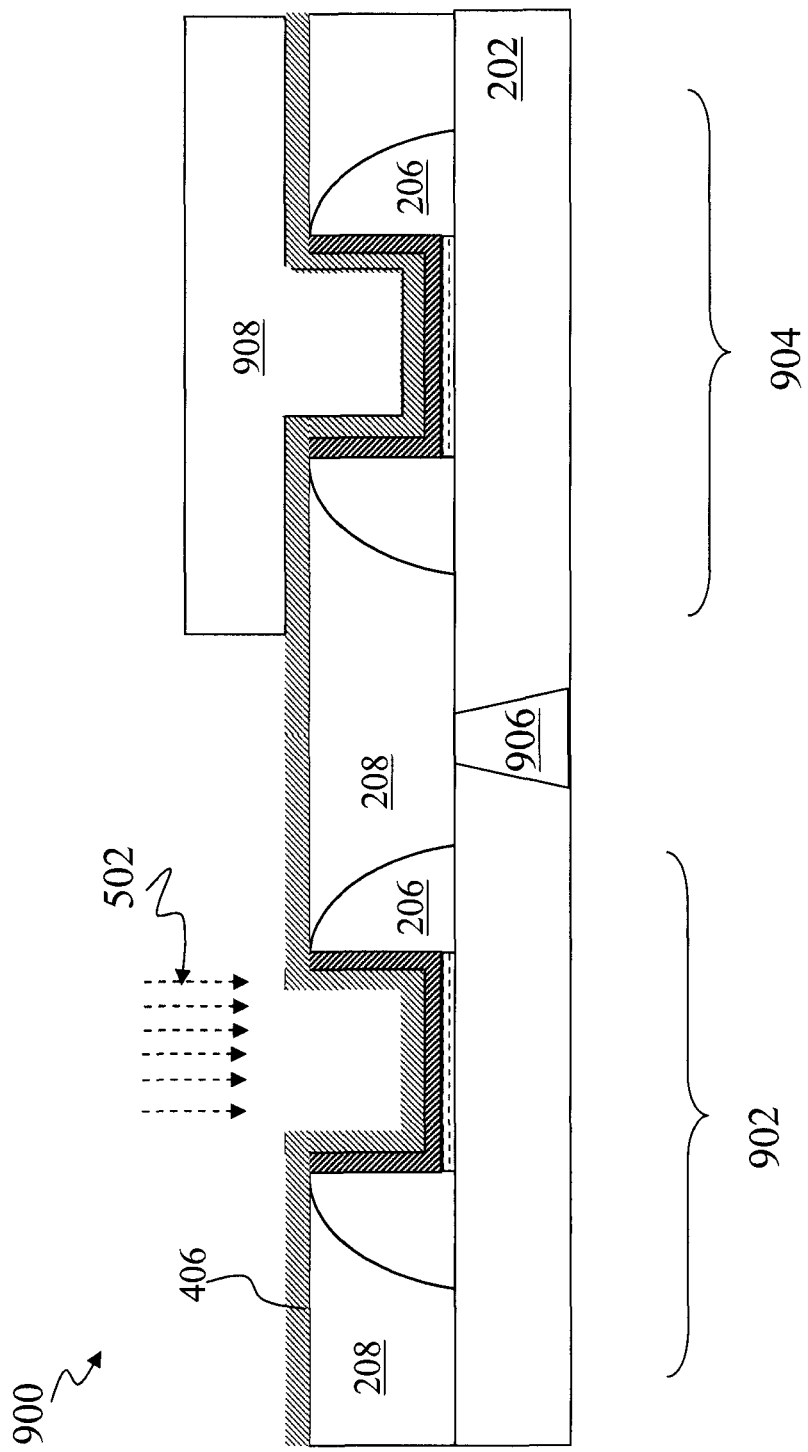
FIGS. 9 and 10 are cross-sectional views of an alternative embodiment of a semiconductor device according to one or more aspects of the method of FIG. 1.
Figure 10:
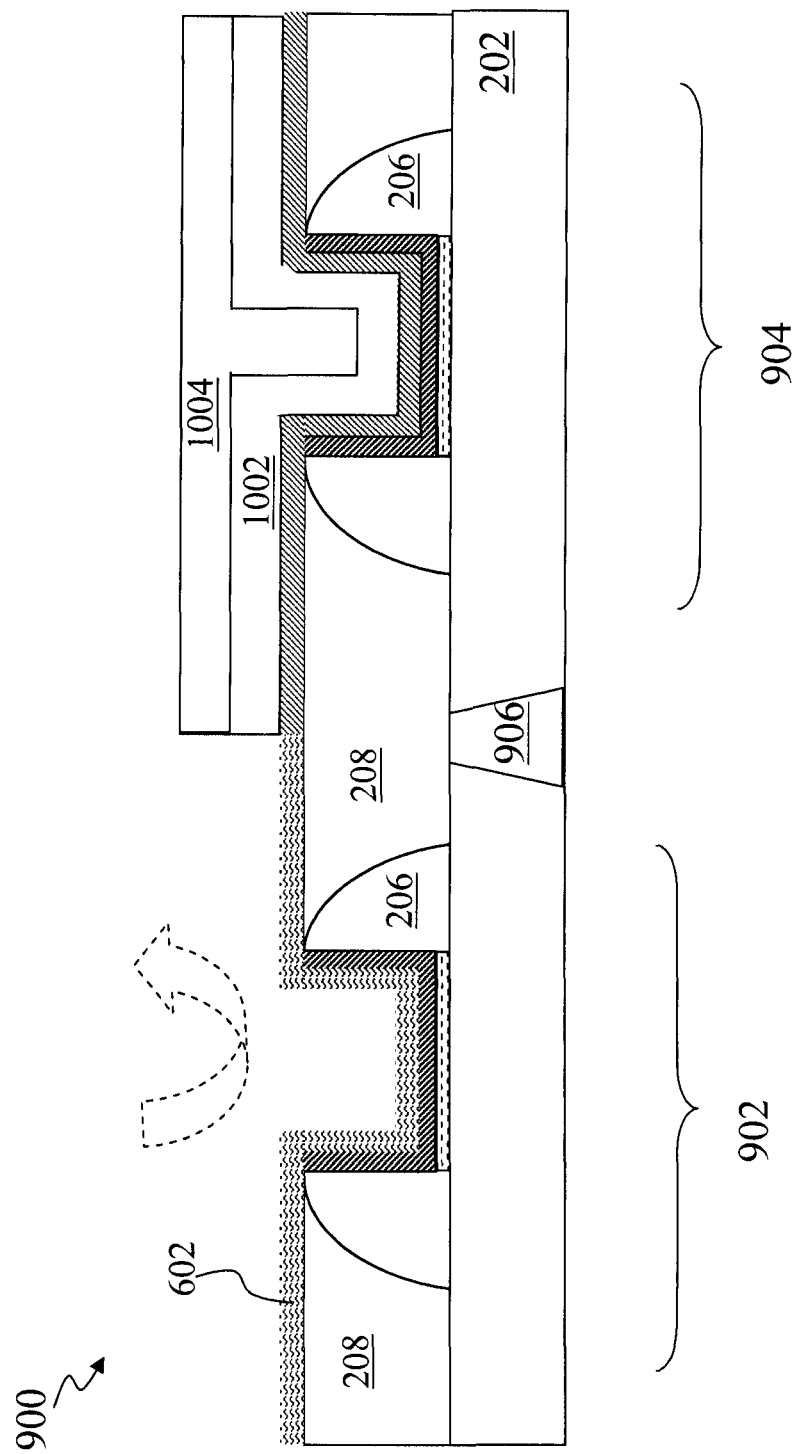

Illustrated in FIG. 1 is a method 100 of fabricating a metal gate structure of a semiconductor device. FIGS. 2-6 are cross-sectional views of a device 200 at various stages of fabrication according to an embodiment of the method 100 of FIG. 1. FIGS. 8, 9 and 10 are also cross-sectional views of a device 800 and a device 900, respectively that may be fabricated according to an embodiment of the method 100 of FIG. 1.

It is understood that parts of the semiconductor devices described herein, and the method 100 may be fabricated by complementary metal-oxide-semiconductor (CMOS) technology process flow, and thus some processes are only briefly described herein. Further, the semiconductor devices may include various other devices and features, such as other types of transistors such as additional transistors, bipolar junction transistors, resistors, capacitors, diodes, fuses, etc., but is simplified for a better understanding of the inventive concepts of the present disclosure. The semiconductor devices may include a plurality of semiconductor devices (e.g., transistors), which may be interconnected.

The method 100 begins at block 102 where a semiconductor substrate is provided. The semiconductor substrate may include a plurality of device regions. In an embodiment, the plurality of device regions may be associated with different types of semiconductor devices. For example, a first region may include one of n-type or p-type field effect transistors. The second region may have the other one of n-type or p-type field effect transistors.

The semiconductor substrate may be silicon substrate. Alternatively, the substrate comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate is a semiconductor on insulator (SOI). In other alternatives, semiconductor substrate may include a doped epi layer, a gradient semiconductor layer, and/or a semiconductor layer overlying another semiconductor layer of a different type, such as a silicon layer on a silicon germanium layer. The substrate may include doped regions, such as a p-well, an n-well, or combination thereof. Isolation regions may also be provided on and in the substrate.

A sacrificial gate structure (also referred to as a dummy gate structure) is disposed on the substrate. A sacrificial gate structure is a sacrificial structure provided in the place where metal gate will be subsequently formed. This process is typically known as a gate-last or replacement gate methodology.

In an embodiment, a gate dielectric layer is formed as part of the sacrificial gate structure and is itself a dummy (e.g., sacrificial) layer. The dummy gate dielectric may be a thermally grown oxide such as silicon dioxide (also referred to as silicon oxide). In an alternative embodiment of the method 100, the gate dielectric underlying the sacrificial gate electrode may not be sacrificial but remain on the substrate (e.g., as in a high-k first, gate last process). In such an embodiment, the gate dielectric may be a high-k dielectric material. The high-k dielectric layer may include hafnium oxide ($HfO_2$).

Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

The sacrificial gate structure further includes a dummy gate electrode. Typically, the dummy gate electrode includes polysilicon, though other embodiments are possible. One or more additional layers may be included in the sacrificial gate structure such as, for example, hard mask layer(s). The dummy gate electrode material is deposited, for example, by physical vapor deposition (PVD) or chemical vapor deposition (CVD).

Figure 2:
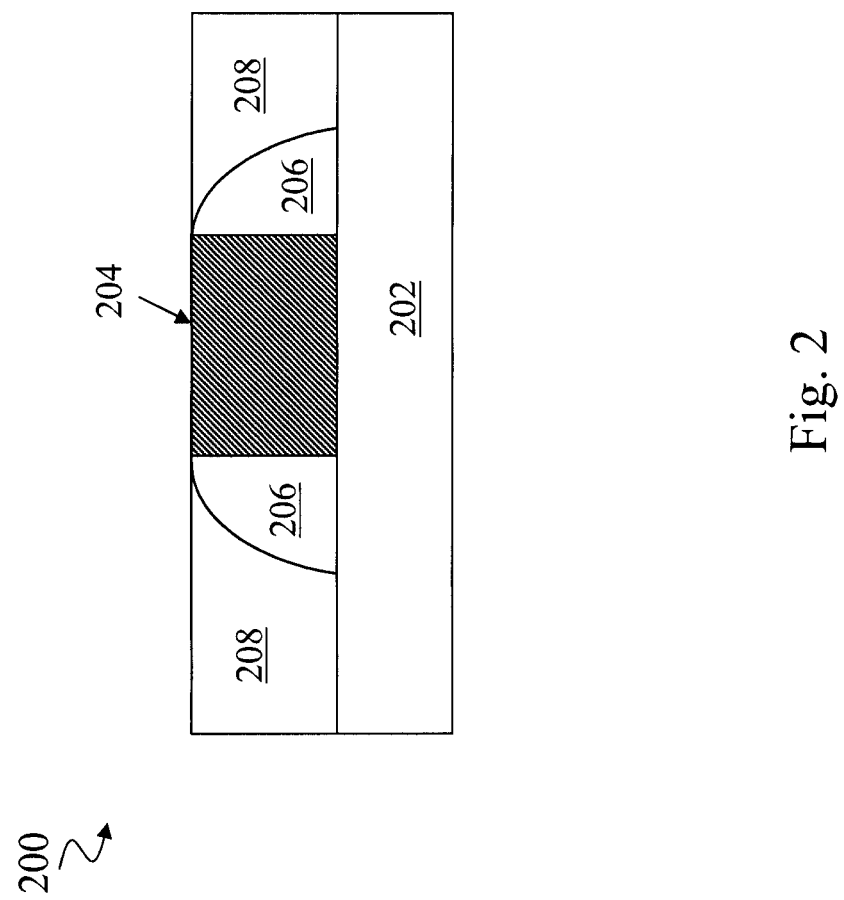
FIGS. 2-6 and 8 are cross-sectional views of an embodiment of a semiconductor device corresponding to one or more aspects of the method of FIG. 1.
Figure 3:
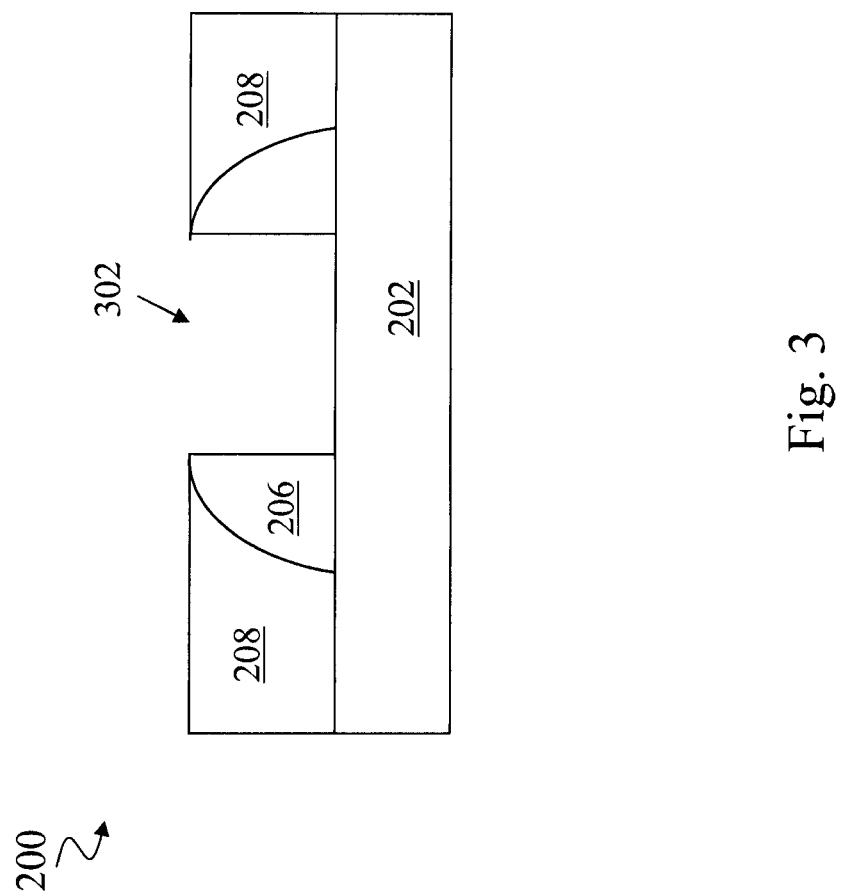

Referring to the example of FIG. 2, a dummy gate structure 204 is formed on a substrate 202. Sidewall spacers 206 abut the dummy gate structure 204. An ILD layer 208 is also disposed on the substrate 202. These elements are typical of a gate replacement process and are not described in specific detail herein.

Sidewall spacers 206 may include silicon nitride, silicon oxide, silicon oxynitride, and/or other suitable dielectric materials. In embodiments, the sidewall spacers 206 include a plurality of layers, for example, liner layers. The ILD layer 208 may be formed by chemical vapor deposition (CVD), high density plasma CVD (HDP-CVD), spin-on deposition, physical vapor deposition (PVD or sputtering), or other suitable methods. The ILD layer 208 may include silicon oxide, silicon oxynitride, a low-k material, and/or other suitable dielectric. The ILD layer 208 may be conformably deposited on the substrate 202 and a CMP process performed. The dummy gate structure 204 may serve as a planarization stop for the CMP process. In other words, the CMP process may be stopped at the exposure of the top surface of the dummy gate structure 204.

As in typical fabrication, source/drain regions or portions thereof may be formed adjacent the dummy gate structures prior to the sidewall spacers and/or ILD layer being formed. Additional steps typical of a gate last or replacement gate process may be performed. The source/drain regions may be formed processes such as ion implantation, thermal diffusion, and/or other suitable processes. The source/drain regions may be suitably doped to provide the relevant conductivity. In an embodiment, the source/drain regions in the first region may provide the source/drain for an NMOSFET and be regions having an n-type dopant (e.g., n+ region). In an embodiment, the source/drain regions in the second region may provide the source/drain for a PMOSFET and be regions having a p-type dopant (e.g., p+ region).

It is noted that a single gate structure (e.g., single transistor) is illustrated in FIG. 2, however this is for ease of description only and it would be typical for a plurality of gate structures, including those associated with different types of transistors, to be disposed on the substrate 202. For example, referring to the example of FIG. 9, a semiconductor substrate 202 is provided. The substrate 202 may be substantially similar to as described above with reference to block 102 of the method 100 and/or the substrate 202 of FIG. 2. The substrate 202 includes a first region 902 and a second region 904. In an embodiment, the first region 902 includes a region where an n-type metal oxide semiconductor field effect transistor (NMOSFET) is formed. In an embodiment, the second region 904 includes a region where a p-type metal oxide semiconductor field effect transistor (PMOSFET) is formed. Other embodiments are possible. The semiconductor substrate 202 of FIG. 9 includes an isolation structures 906 formed on the substrate 202 for isolating the regions of the substrate. The isolation structures 906 may be formed of silicon oxide, silicon nitride, silicon oxynitride, fluoride-doped silicate glass (FSG), a low-k dielectric material, and/or other suitable insulating material. The isolation structures 906 may be shallow trench isolation (STI) features, local oxidation (e.g., LOCOS), and/or other suitable isolation structures. In an embodiment, the isolation structure 906 is an STI feature and is formed by etching a trench in the substrate 202. The trench may then be filled with isolating material, followed by a chemical mechanical polish (CMP).

Referring again to FIG. 1, the method 100 then proceeds to block 104 where the sacrificial (dummy) gate structure is removed from the substrate. The sacrificial gate structure removal may include removing a dummy gate electrode and/or a dummy gate dielectric layer. The removal of the sacrificial gate structure provides for openings within which a metal gate will be formed. A sacrificial gate structure may be removed by an etching solution such as, for example, $NH_4OH$, dilute-HF, and/or other suitable etchant. In an alternative embodiment, the sacrificial gate structure may be removed by a suitable dry etching process. Example etchants include fluorine and/or chlorine based etchants. Exemplary processes to remove the dummy gate dielectric layer include liquid or gas phase diluted HF. Referring to the example of FIG. 3, the dummy gate structures 204 (described above and illustrated in FIG. 2) have been removed from the substrate leaving openings (or trenches) 302.

The method 100 then proceeds to block 106 where one or more layers of a metal gate structure are formed on the substrate, including in the opening provided in block 104. The layers may include interfacial layer(s), gate dielectric layer(s), capping layer(s), etch stop layer(s), work function layer(s), fill metal layer(s), and/or other suitable layers. Exemplary layers are described below, one or more or which may be included in the metal gate structure.

In an embodiment, an interfacial layer is first formed on the substrate. The interfacial dielectric layer may include silicon oxide layer ($SiO_2$) or silicon oxynitride (SiON). In an embodiment, the interfacial dielectric has a thickness ranging from about 5 to about 15 angstroms. The interfacial dielectric layer may be formed by chemical oxidation, thermal oxidation, atomic layer deposition (ALD), CVD, and/or other suitable dielectric. In other embodiments, the interfacial layer is omitted. Referring to the example of FIG. 4, an interfacial layer 402 is formed on the substrate 202 in the openings 302.

In an embodiment, a gate dielectric layer is formed on the interfacial layer. The gate dielectric layer may include silicon dioxide or other suitable dielectric. In an embodiment, the gate dielectric is a high-k dielectric layer. (As noted above, in alternative embodiments, the method 100 may include a gate dielectric first process where the gate dielectric formed underlying the dummy gate electrode is not removed.) The high-k dielectric layer may include hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods. The gate dielectric layer may be between approximately 10 Angstroms and approximately 100 Angstroms in thickness. Referring to the example of FIG. 4, a high-k gate dielectric layer 404 is formed on the substrate 202. It is noted that the configuration of the gate dielectric layer 404 is exemplary only and in other embodiments the gate dielectric layer 404 may initially be formed on a top surface of the ILD layer 208 and subsequently removed using a planarization process (e.g., with one or more overlying layers).

One or more layers are formed on the gate dielectric layer. The layers may also be included in the metal gate structure. One or more of the layers formed on the gate dielectric layer may include a metal. Exemplary layers that may be formed on the gate dielectric layer are described below, one or more of which may be included in the metal gate structure.

In an embodiment, an etch stop layer is formed on the substrate over the gate dielectric layer. In an embodiment, the etch stop layer is TaN. The etch stop layer may be formed by atomic layer deposition (ALD), chemical vapor deposition (CVD), and/or other suitable process. In an embodiment, the etch stop layer is between approximately 5 Angstroms and approximately 50 Angstroms. The etch stop layer may be used to protect a gate dielectric layer during the patterning process. In an embodiment, the etch stop layer protects the gate dielectric layer during the removal of an overlying dummy gate electrode (as described in block 102 and 104). Thus, in such an embodiment, the etch stop layer is formed prior to an overlying dummy gate electrode (e.g., polysilicon). In other embodiments, the etch stop layer is omitted.

In an embodiment, a capping layer may be formed on the substrate over the gate dielectric layer. The capping layer may include TiN, TaN, and/or other suitable compositions. In an embodiment, the capping layer is 1:1 Ti:N. In an embodiment, the capping layer is 1:1 Ta:N. The capping layer may tuning a work function (for the gate electrode) The capping layer may include a thickness ranging from about 2 angstroms to about 10 angstrom (A). The capping layer may be formed by ALD, CVD, MOCVD, PVD, combination thereof, or other suitable deposition technique. In other embodiments, the capping layer is omitted from the metal gate structure.

In an embodiment, one or more work function metal layers are formed on the substrate on the gate dielectric layer. The work functional metal layer may be a p-type work function metal (or p-metal) or an n-type work function metal (or n-metal). Exemplary p-type work function metals include TiN, TaN, Ru, Mo, WN, $ZrSi_2$, $MoSi_2$, $TaSi_2$, $NiSi_2$, WN, other suitable p-type work function materials, or combinations thereof. Exemplary n-type work function metals include Ti, Ag, Al, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a desired threshold voltage Vt is achieved in the device including the gate structure. The work function layer may be deposited by CVD, PVD, and/or other suitable process.

Figure 4:
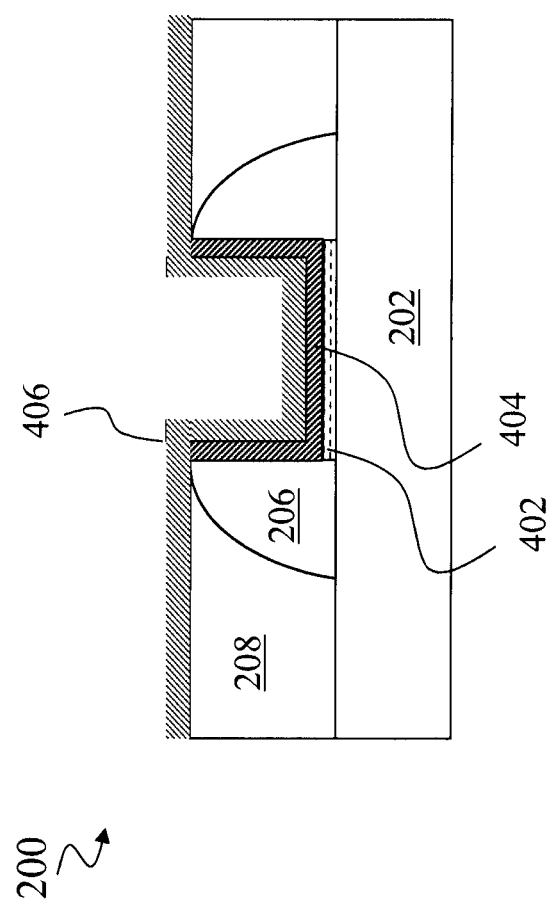

Referring to the example of FIG. 4, a layer 406 is disposed on the substrate 202 including in the opening 302. The layer 406 is formed on the gate dielectric layer 404. Numerous other layers may be present in the device 200 illustrated in FIG. 4 which are not specifically shown including for example, one or more of the layers discussed above. The layer 406 includes metal. The layer 406 may be a capping layer, an etch stop layer, a work function layer, and/or other layer of a metal gate structure that is to be disposed in the opening 302. In an embodiment, the layer 406 includes a plurality of layers having a different composition.

The method 100 then proceeds to block 108 where a stress modulation process is performed on one or more of the layers of the metal gate structure. The stress modulation process is a post-deposition process, which alters the stress properties of a formed target layer or layers.

In an embodiment, the stress modulation process is performed on a capping layer. In an embodiment, the stress modulation process is performed on an etch stop layer. In an embodiment, the stress modulation process is performed on one or more work function layers. In an embodiment, the stress modulation process is performed on a plurality of layers (e.g., an etch stop layer and the work function layer; a capping layer and a work function layer; a capping layer, an etch stop layer, a work function layer, and/or other combinations of layers of the metal gate structure).

The stress modulation process may be performed on a layer after its deposition, and before the deposition of an overlying layer. In an embodiment, a first layer is formed, the stress modulation process is performed on the first layer, then a second layer is formed and the stress modulation process is performed on the second layer. In another embodiment, a single stress modulation process is performed on a single layer.

In an embodiment, the stress modulation process is performed on a plurality of layers (e.g., a stack) after their deposition, for example, a layer and one or more underlying layers may be simultaneously treated. In an exemplary embodiment, a first layer is formed, a second layer is formed on the first layer, and a stress modulation process is performed which affects both the first and the second layer.

Numerous other embodiments are possible and within the scope of the present disclosure. The stress modulation process can be performed on any layer overlying the substrate (e.g., overlying a channel region of a substrate). The stress modulation process can be performed on any layer overlying the substrate, which is a portion of metal gate structure. The stress modulation process can be performed on any layer overlying the substrate, which is a portion of a metal gate structure for an n-type field effect transistor (NFET).

The stress modulation process includes performing a process that alters the stress of a layer. The stress modulation process may alter a layer such that it is a compressive film (or more compressive). In an embodiment, the stress modulation process alters a layer from tensile to compressive. In an embodiment, the stress modulation process alters a layer from tensile to compressive that is formed on or in a gate structure of an NFET device. In an embodiment, the stress modulation process alters a layer from tensile to compressive, where the layer overlies a channel region of an NFET device.

In an embodiment, the stress modulation process includes an ion-implantation process. The ion-implantation process may include introducing one or more dopants (or impurities) to the target layer. The parameters or conditions of the ion-implantation process (e.g., energy, dose, implant species, etc) may be determined depending upon the desired densification and/or stress modulation to be achieved in the target layer. The ion-implantation process may be a low-energy process. In an embodiment, the ion-implantation process includes an energy between approximately 0.1 keV and approximately 1.5 keV. In an embodiment, the ion-implantation process includes a dose concentration between approximately $1E14$ atoms/$cm^2$ and approximately $5E15$ atoms/$cm^2$. In a further embodiment, the ion-implantation process includes a dose concentration of approximately $1E14$ atoms/$cm^2$. Exemplary dopants that may be introduced to the target layer include neutral implant species such as Si(28), Ar(40), Ge(73), Xe(131), and/or combinations thereof.

Figure 5:
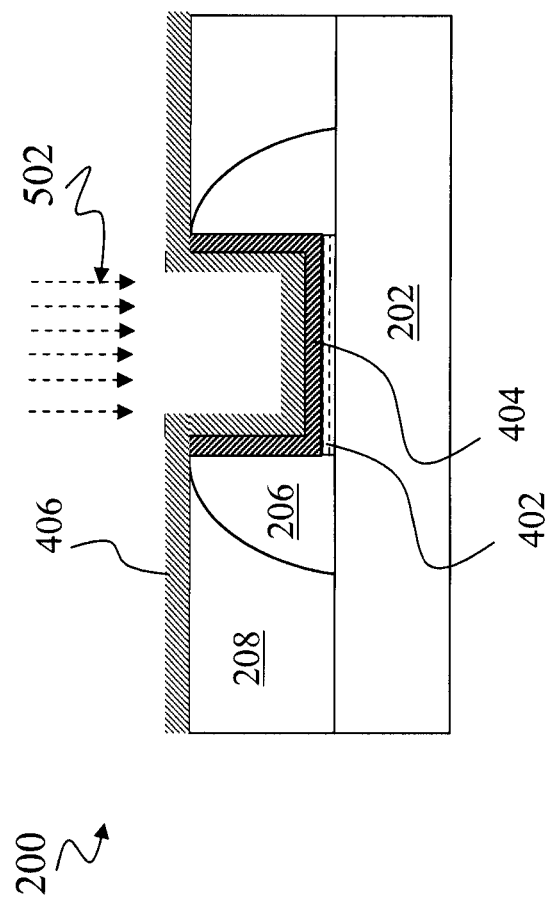

Referring to the example of FIG. 5, a stress modulation process, namely an ion-implantation 502 provides incident dopants on the target layer 406. The ion-implantation may include as Si, Ar, Ge, Xe, combinations thereof, and/or other neutral ion species. One or more masking elements may be present on the substrate 202 to target specific portions of the layer 406.

Figure 6:
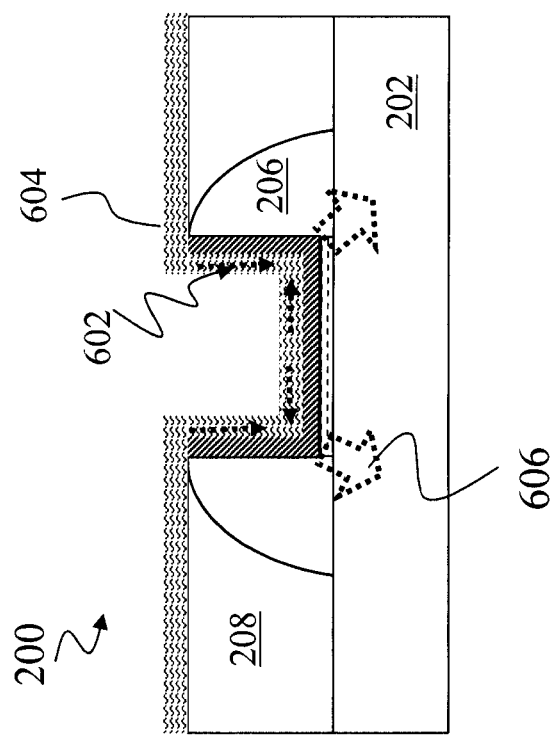

Referring to the example of FIG. 6, on account of the stress modulation process including the ion implantation 502, illustrated in FIG. 5, a compressive stress 602 is introduced to the layer 406, which is now denoted as compressive layer 604. The compressive stress 602 may introduce tension to the substrate 202 underlying the layer 604 as illustrated by tension force 606. The tension force 606 may provide a tensile stress in a channel region of the device. Thus, the performance of the device (e.g., NFET) may be enhanced. The layer 604 has an increased compressive stress as compared to the layer 406.

The method 100 may proceed to provide for additional layers of the metal gate structure including, for example, a fill metal. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate electrode.

The method 100 may also proceed to include formation of other features of the device not discussed in detail herein, such as, for example, back-end-of-the-line (BEOL) processing and features (multi-layer interconnects), contacts, and/or other suitable features as known in the art.

Thus, provided is an embodiment of a method that provides for performing a stress modulation process (e.g., ion implantation) on a layer overlying a channel region of the substrate (e.g., a layer of a metal gate structure). The layer may include a metal layer such as an etch stop layer, capping layer, or work function layer. The stress modulation process may be performed on any number of layers after their formation (e.g., deposition) either individually or as a stack. The stress modulation alters a target layer or layers to provide a compressive stress, which introduces a tensile stress in the underlying channel region. For an NFET device, this may be beneficial to boosting performance.

Figure 7:
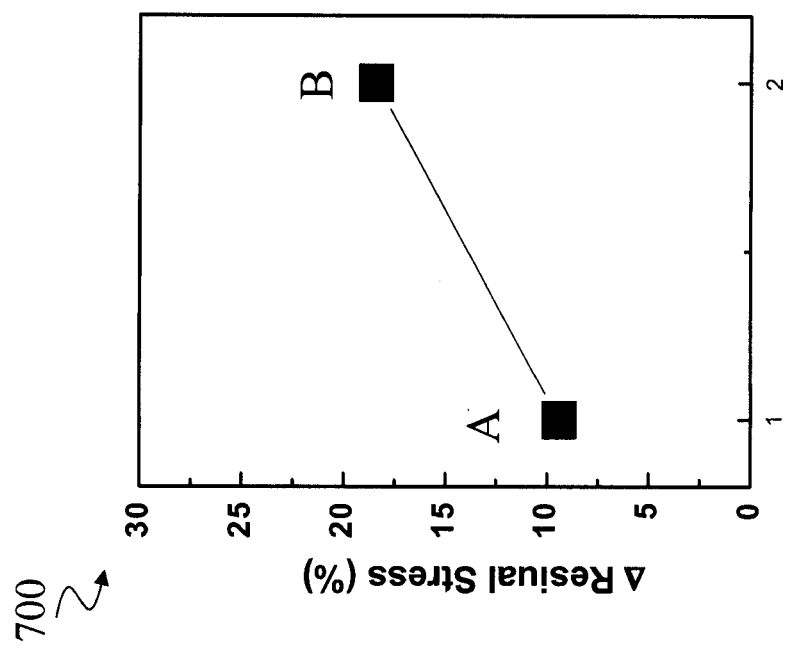
FIG. 7 is a graphical representation of an embodiment of the stress of a device fabricated by the method of FIG. 1.

Referring now to FIG. 7, an experimental embodiment is illustrated. The graph 700 illustrates a change in stress of a target TaN layer. The x-axis of the graph illustrates the dose of implant species (Ar) in atoms/cm$^2$ and the y-axis of the graph 700 illustrates the change in residual stress in percentage of the target TaN layer. The experimental embodiment includes an implant energy of approximately 0.5 keV. A first condition A shows an implant concentration of 5E14 Ar atoms/cm$^2$. A second condition B shows an implant concentration of 1E15 Ar atoms/cm$^2$. The graph 700 illustrates from condition A to condition B a modification of stress from 10% to 18% (tensile to compressive). The graph 700 is exemplary only and not intended to be limiting.

Referring again to FIG. 1 and also to FIG. 8, illustrated is a device 800. The device 800 may be substantially similar to the device 200 described above. The device 800 may be formed using one or more aspects of the method 100 of FIG. 1, also described above. The device 800 is provided herein to further illustrate the fact that a stress modulation process (block 108 of the method 100) may be performed on a stack of layers, here layer 802 and 804, where one or both of the layers are affected (e.g., changed in stress) on account of the stress modulation 502. In an embodiment, layers 802 and/or 804 are layers including metal. In an embodiment, layers 802 and/804 are each one of a capping layer, an etch stop layer, and/or a work function layer. One or more of these layers may be substantially similar to as described above with reference to block 106 of the method 100 and layer 406 of FIGS. 4, 5, and/or 6.

FIG. 8 illustrates a stress modulation process, ion implantation 502, performed on a stack of layers including 802 and 804. However, in other embodiments, layer 802 may be deposited and an ion implantation 502 performed, followed by the layer 804 deposition (e.g., on the treated layer 802), and a subsequent ion implantation process 502. In other embodiments, the subsequent ion implantation process of the layer 804 may be omitted.

Referring now to FIGS. 9 and 10, in conjunction with FIG. 1, illustrated is a device 900. The device 900 may be substantially similar to the device 200 and/or 800, described above with reference to FIGS. 2, 3, 4, 5, 6, and 8. The device 900 may be fabricated using the method 100, described above with reference to FIG. 1. As described above, the device 900 includes the first region 902 and the second region 904, which may be regions where an NFET and PFET device(s) are formed respectively.

FIG. 9 includes a masking element 908 which covers the second region of the substrate 202, region 904. The masking element 908 may include photoresist. In some embodiments, the masking element 908 may include hard mask. An exemplary hard mask material is spin-on glass (SOG). In embodiments, the masking element may include ceramic, spin-on or chemical/physical deposition polymer, low melting point ceramic, and/or other suitable materials. The masking element 908 may be formed by deposition of photoresist (e.g., spin-on) and photolithography processes to pattern the deposited photoresist including exposure, bake, development, and further bake and cleaning processes.

In an embodiment, region 904 includes a region of the substrate where PFET devices will be formed. Thus, the stress modulation process 502 performed on the device 900 may be limited to the first region 902, or the region where NFET devices will be formed. Thus, the masking element 908 allows for stress modulation of the layer 406 in an NFET region and not in a PFET region. (The layer 406 may be substantially similar to as described above with reference to block 106.) Thus, the channel region of the NFET device may be affected by the process 502 and the PFET device may not be.

Referring now to FIG. 10, illustrated is the device 900 at a subsequent processing stage. The layer 406 has been changed to the treated layer 602 on account of the stress modulation process 502 (ion implantation). A work function metal 1002 is disposed on the second region 904 of the substrate 202. In an embodiment, the work function metal 1002 is a p-type metal. Exemplary p-type metals include TiN, TaN, Ru, Mo, WN, ZrSi$_2$, MoSi$_2$, TaSi$_2$, NiSi$_2$, WN, and/or combinations thereof.

The work function metal 1002 may be initially formed across the substrate 202 including on the treated layer 602, then removed from the region 902 as described below. A masking element 1004 is disposed on the work function metal 1002 in the second region 904. The masking element 1004 may include photoresist. In some embodiments, the masking element 1004 may include hard mask. An exemplary hard mask material is spin-on glass (SOG). In embodiments, the masking element may include ceramic, spin-on or chemical/physical deposition polymer, low melting point ceramic, and/or other suitable materials. The masking element 1004 may be formed by deposition of photoresist (e.g., spin-on) and photolithography processes to pattern the deposited photoresist including exposure, bake, development, and further bake and cleaning processes. An etching process may remove the work function metal 1002 from the treated layer 602, while the masking element 1004 protects the work function metal 1002 in region 904. Exemplary etches to remove the work function metal 1002 include a fluorine/chlorine based dry etch, an HCl wet etch, a NH$_4$OH solution wet etch, and/or other suitable etchants.

Having an underlying layer of the treated layer 602 may provide advantages over removal of the work function metal 1002 from the native layer 406 in the region 902. For example, the increase in impurity concentration from the stress modulation process 502 may decrease the amount of material loss suffered by the treated layer 602 during the removal of the work function metal 1002.

Figure 11:
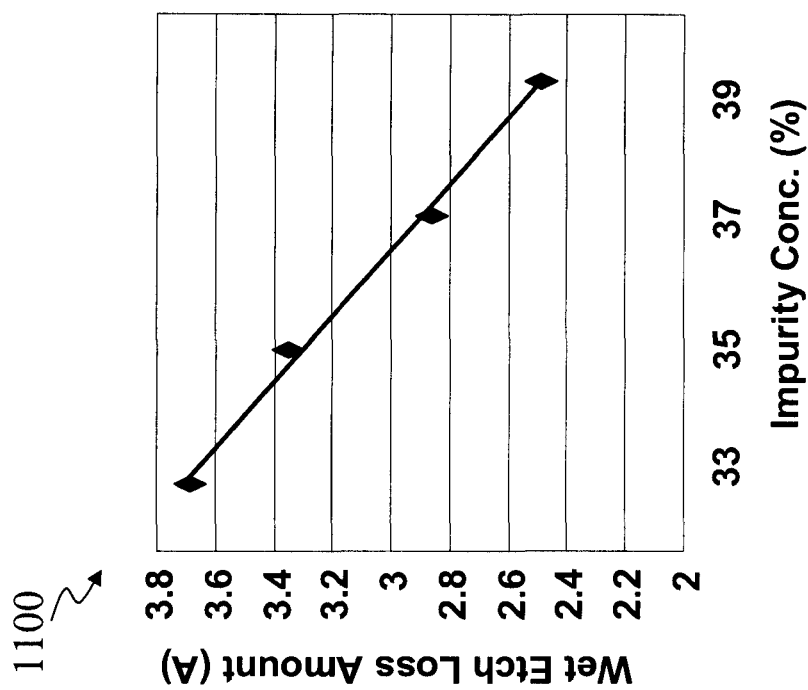
FIG. 11 is a graphical representation of an embodiment of the etch rate of a layer of a device fabricated by an embodiment of the method of FIG. 1.

FIG. 11 illustrates a graph 1100 which compares an impurity concentration (in weight percentage) with an etch loss amount in Angstroms (e.g., from a wet etch process). As illustrated by the graph 1100, increased impurity concentration provides for decreased etch loss amounts.

In summary, the methods and devices disclosed herein provide for increased tensile stress in a channel region of a device (e.g., NFET). The stress is provided by forming a compressive layer in the metal gate structure that overlies the channel region. The compressive layer may be formed by treating a formed layer (e.g., including metal) of the gate stack using an ion implantation process. In doing so, embodiments of the present disclosure may offer several advantages over prior art devices. Advantages of the present disclosure include an ability to tune a residual stress applied to the substrate (e.g., by different implant conditions), an altering of a film for reduction in loss of material during etching process (es), a boost of performance of an associated NFET device, and/or an introduction of a compressive film on a gate dielectric without damage to the gate dielectric layer. It is understood that different embodiments disclosed herein offer different disclosure, and that they may make various changes, substitutions and alterations herein without departing from the spirit and scope of the present disclosure.

What is claimed is:

1. A method of semiconductor device fabrication, the method comprising:
   providing a semiconductor substrate having a sacrificial gate structure disposed on the semiconductor substrate, wherein opposing spacers are disposed on the sacrificial gate structure;
   removing the sacrificial gate structure to form an opening between the opposing spacers;
   forming a metal gate structure in the opening, wherein the forming the metal gate structure includes:
   providing a gate dielectric layer;
   forming a first layer on the gate dielectric layer, wherein the first layer includes a metal;
   implanting the first layer with a neutral species; and
   forming a second layer on the first layer.

2. The method of claim 1, wherein the implanting the first layer includes changing the first layer from a tensile layer to a compressive layer.

3. The method of claim 1, wherein the first layer is a work function metal layer.

4. The method of claim 1, wherein the first layer is an n-type work function metal layer.

5. The method of claim 1, wherein the forming the first layer includes at least one of atomic layer deposition (ALD), physical vapor deposition (PVD), and chemical vapor deposition (CVD).

6. The method of claim 1, wherein the first layer is at least one of a capping layer and an etch stop layer.

7. The method of claim 6, wherein the second layer is a work function metal layer.

8. The method of claim 7, further comprising: implanting the second layer with a neutral species.

9. The method of claim 8, wherein the implanting the first layer and the implanting the second layer are performed simultaneously.

10. A method of semiconductor fabrication, comprising:
    forming a gate dielectric on a first region and a second region of a semiconductor substrate;
    forming a first gate electrode on the gate dielectric on the first region, wherein the first gate electrode is associated with an n-type device, and wherein the forming the first gate electrode includes implanting at least one layer of the first gate electrode to increase the compressive stress in the at least one layer; and
    forming a second gate electrode on the gate dielectric on the second region, wherein the second gate electrode is associated with a p-type device and includes a p-type work function layer.

11. The method of claim 10, wherein the forming the second gate electrode includes removing the p-type work function layer from the first region.

12. The method of claim 11, wherein the p-type work function layer is formed directly on the implanted layer of the first gate electrode, and thereafter the p-type work function layer is removed from the implanted layer.

13. The method of claim 10, wherein the implanting the at least one layer includes implanting at least one of a work function metal layer, a capping metal layer, and an etch stop layer.

14. The method of claim 10, wherein the implanting the at least one layer includes implanting two layers selected from the group consisting of a work function metal layer, a capping metal layer and an etch stop layer.

15. The method of claim 10, wherein the implanting the at least one layer includes implanting a layer having a composition selected from the group consisting of Ti, Ag, Al, TaAl, TaAlC, TiAlN, TaC, TaCN, TaSiN, Mn, Zr, and combinations thereof.

16. The method of claim 10, wherein the implanting the at least one layer includes implanting one of a TaN layer and a TiN layer.

17. A method of semiconductor device fabrication, the method comprising:
    providing a substrate having a sacrificial gate structure disposed on the semiconductor substrate, wherein opposing spacers are disposed on the sacrificial gate structure;
    removing the sacrificial gate structure to form an opening between the opposing spacers;
    forming a metal gate structure in the opening, wherein the forming the metal gate structure includes:
    providing a gate dielectric layer;
    forming a first layer on the gate dielectric layer, wherein the first layer includes a metal;
    implanting the first layer with at least one of silicon, argon, germanium, and xenon;
    forming a work function layer on the first layer; and
    implanting the work function layer with at least one of silicon, argon, germanium, and xenon.

18. The method of claim 17, further comprising:
    forming a second layer on the first layer; and
    implanting the second layer with at least one of silicon, argon, germanium, and xenon.

19. The method of claim 18, wherein the implanting the first layer, implanting the second layer, and implanting the work function layer are performed simultaneously.

20. The method of claim 17, wherein the forming the work function layer is performed after the implanting the first layer.

* * * * *